(12) United States Patent
Cho et al.

(10) Patent No.: US 7,205,098 B2
(45) Date of Patent: Apr. 17, 2007

(54) METHOD FOR MANUFACTURING HIGH-TRANSMITTANCE OPTICAL FILTER FOR IMAGE DISPLAY DEVICES

(75) Inventors: Sung Hen Cho, Seoul (KR); Euk Che Hwang, Osan-si (KR); Jin Young Kim, Suwon-si (KR); Chang Ho Noh, Suwon-si (KR); Ki Yong Song, Seoul (KR); Ho Chul Lee, Suwon-si (KR)

(73) Assignee: Samsung Corning Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/280,393

(22) Filed: Nov. 17, 2005

(65) Prior Publication Data

US 2006/0127818 A1 Jun. 15, 2006

(30) Foreign Application Priority Data

Nov. 19, 2004 (KR) ............ 10-2004-0095283

(51) Int. Cl.
G02B 5/20 (2006.01)

(52) U.S. Cl. ............ 430/321; 430/323; 427/164; 427/304; 427/305; 427/306; 205/122; 216/24; 174/388

(58) Field of Classification Search ............ None
See application file for complete search history.

(56) References Cited

U.S. PATENT DOCUMENTS 6,188,174 B1 * 2/2001 Marutsuka ............ 313/479

2003/0013048 A1 * 1/2003 Gilson ............ 430/321
2005/0003242 A1 * 1/2005 No et al. ............ 428/701
2005/0178569 A1 * 8/2005 Kotsubo ............ 174/35 MS

FOREIGN PATENT DOCUMENTS

| JP | 5-16281 | 1/1993 |
| JP | 10-72676 | 3/1998 |
| JP | 10-278800 | 10/1998 |
| JP | 11-119675 | 4/1999 |
| JP | 2003-109435 | 4/2003 |
| KR | 10-2003-0030110 | 5/2003 |

* cited by examiner

Primary Examiner—John A. McPherson
(74) Attorney, Agent, or Firm—Buchanan Ingersoll & Rooney PC

(57) ABSTRACT

A method for manufacturing a high-transmittance optical filter for image display devices, which may include the steps of coating a photocatalytic compound on a transparent substrate to form a photocatalytic film, selectively exposing the photocatalytic film to light and growing a metal crystal thereon by plating to form a metal pattern, and selectively etching and removing the photocatalytic compound remaining on the transparent substrate using a buffered oxide etchant (BOE). According to the method, a high-transmittance, high-resolution and low-resistivity optical filter can be manufactured in a simple manner at low costs.

17 Claims, 3 Drawing Sheets

METHOD FOR MANUFACTURING HIGH-TRANSMITTANCE OPTICAL FILTER FOR IMAGE DISPLAY DEVICES

This non-provisional application claims priority under 35 U.S.C. §119(a) on Korean Patent Application No. 2004-95283 filed on Nov. 19, 2004 which is herein incorporated by reference.

BACKGROUND OF THE INVENTION

1. Field of the Invention

Embodiments of the present invention relate to a method for manufacturing a high-transmittance optical filter for image display devices and an optical filter manufactured by the method. More specifically, embodiments of the present invention relate to a method for manufacturing an optical filter with high transmittance, high resolution and low resistivity which comprises selectively exposing a photocatalytic film formed on a transparent substrate to light and growing a metal crystal thereon by plating to form a metal pattern, and selectively etching the photocatalytic compound remaining on the transparent substrate using a buffered oxide etchant (BOE).

2. Description of the Related Art

Various kinds of image display devices, including liquid crystal displays (LCDs), plasma display panels (PDPs), electroluminescent displays (ELDs), field emission displays, and the like, are in practical use at present. Among these image display devices, plasma display panels have received a great deal of attention as large-size wall-mounted televisions and large-screen multimedia displays.

The principle of light emission of plasma display panels is as follows. First, an inert gas, such as helium, neon, argon and xenon, is charged and sealed in barrier ribs. Thereafter, application of a voltage ionizes the gas to form a plasma and emit UV rays. The emitted UV rays excite phosphors to cause the phosphors to emit light. FIG. 1 is a view showing the overall structure of a general plasma display module and an optical filter thereof. Near-infrared (NIR) rays capable of causing malfunction of cell phones and remote controllers, electromagnetic (EM) waves adversely affecting humans and other electronic devices, and neon light causing deterioration of color reproduction are emitted from PDPs in terms of their driving characteristics. Accordingly, it is required to limit the level of the unnecessary rays, waves and light to specific values. To this end, front filters are mounted on PDPs to shield near-infrared rays and unnecessary electromagnetic waves as well as to decrease the amount of light reflected from external illuminators. Since such front filters are provided in front of PDPs, they must satisfy the requirement of high transparency.

Japanese Patent Laid-open No. Hei 10-278800 discloses a method for forming a transparent electrode on a display plane of a screen by sputtering or deposition. This method, however, has problems that sufficient electromagnetic wave shielding effects are not attained without a reduction in transparency and conversely high transparency is not achieved without a deterioration in electromagnetic wave shielding performance. At this time, the formation of a film having a thickness of 100 Å to 2,000 Å is required in order to ensure sufficient transparency of visible rays emitted from PDP devices. However, within this film thickness range, sufficient electromagnetic wave shielding effects cannot be attained.

Japanese Patent Laid-open No. Hei 11-119675 discloses a process for producing an electromagnetic wave shielding filter. Specifically, this process comprises the steps of forming (masking) a plating resistant resist mask for continuously or intermittently plating a mesh on a continuous loop-shaped substrate having plating resistance properties, electrodepositing a metallic thin-film layer consisting of a particular material for mesh formation on portions of the substrate surface exposed from the resist mask, and adhering and transferring the electrodeposited metal thin-film layer to a surface of the transparent substrate for an electromagnetic wave shielding plate using an adhesive. Although an electromagnetic wave shielding filter manufactured by the method exhibits better resolution and electromagnetic wave shielding performance, the method is unsuitable for mass production because of its low yield.

Japanese Patent Laid-open No. 2003-109435 discloses a method for manufacturing a transparent conductive film wherein the transparent conductive film is composed of a metallic ultrafine particle catalyst layer formed into a prescribed pattern on a transparent base substance and a metallic layer formed on the metallic ultrafine particle catalyst layer. According to this method, pattern printing is applied on the transparent base substance by paste containing electroless plating catalyst, and electroless plating treatment is applied on the pattern-printed electroless plating catalyst, in order to form a transparent conductive metallic layer only on a pattern-printed part. The method does not involve complex processes, e.g., photoresist and etching, and is advantageous in terms of easy manufacturing procedure, but has disadvantages that the optical filter has poor resolution and low yield, which are obstacles in large-scale manufacturing.

As alternative examples, Japanese Patent Laid-open Nos. Hei 5-16281 and 10-72676 disclose methods for producing a electromagnetic wave shielding material by forming a transparent resin layer on a transparent substrate, e.g., a polycarbonate substrate, electroless copper plating the resin layer, and forming a mesh pattern thereon by an etching process, e.g., microphotolithography. Although these methods are advantageous in terms of processing in that a metal thin film is treated, they have problems that the composition of an etching solution used, etching temperature and etching time are difficult to manage upon etching by microphotolithography.

As explained previously, since most of the prior art techniques involve a process for forming a metal thin film, which requires high vacuum/high temperature conditions or an exposure process for forming a fine shape and a subsequent etching process to form a mesh pattern, the overall procedure may be complicated and considerable processing costs may be incurred. On the other hand, aforementioned methods involving a process for forming a metal thin film and an etching process are advantageous in terms of low processing costs, but have disadvantages in that optical filters having insufficient resolution and low transmittance are manufactured in low yields, and therefore the methods are not suitable for large scale manufacturing of optical filters.

The present inventors have proposed a method for forming a metal pattern by coating a photocatalytic compound on a substrate, selectively exposing the photocatalytic compound to light to form a latent pattern acting as a nucleus for crystal growth by photoreaction, and plating the latent pattern to grow metal crystals thereon (Korean Patent Application No. 2003-30110). However, an area for improvement of an optical filter manufactured by the method is that a photocatalytic layer applied over the entire surface of the substrate still remains, causing a reduction in the transmittance of the optical filter (see, FIG. 2).

OBJECTS AND SUMMARY

It is an object of embodiments of the present invention to provide a method for manufacturing a high-transmittance, high-resolution and low-resistivity optical filter for image display devices by forming a metal pattern in a simple and cost-effective manner without the need for a sputtering process requiring high vacuum/high temperature conditions, a photopatterning process using a photosensitive resin or an etching process, and selectively removing a photocatalytic layer formed on a substrate.

In accordance with one embodiment of the present invention for achieving the above object, there is provided a method for manufacturing a high-transmittance optical filter for image display devices, the method comprising the steps of:

coating a photocatalytic compound on a transparent substrate to form a photocatalytic film (a first step);

selectively exposing the photocatalytic film to light and growing a metal crystal thereon by plating to form a metal pattern (a second step); and selectively etching and removing the photocatalytic compound remaining on the transparent substrate using a buffered oxide etchant (BOE) (a third step).

In accordance with another embodiment of the present invention, there is provided a flat display panel comprising an optical filter manufactured by the method.

BRIEF DESCRIPTION OF THE DRAWINGS

The above and other objects, features and other advantages of embodiments of the present invention will be more clearly understood from the following detailed description taken in conjunction with the accompanying drawings, in which.

DETAILED DESCRIPTION OF THE PREFERRED EMBODIMENTS

Embodiments of the present invention will now be described in more detail with reference to the accompanying drawings.

According to the method of an embodiment of the present invention, an optical filter for image display devices is manufactured in accordance with the following procedure. First, a photocatalytic compound is coated on a transparent substrate to form a photocatalytic film (a first step). Thereafter, the photocatalytic film is selectively exposed to light to form a latent pattern acting as a nucleus for crystal growth, and then the latent pattern is subjected to plating to grow a metal crystal thereon, thereby forming a metal pattern (a second step). Finally, the photocatalytic compound remaining on the transparent substrate is selectively etched and removed using a buffered oxide etchant (BOE) (a third step). Hereinafter, a method of embodiments of the present invention will be explained in more detail based on the respective steps.

1. Formation of Photocatalytic Film

Figure 1:
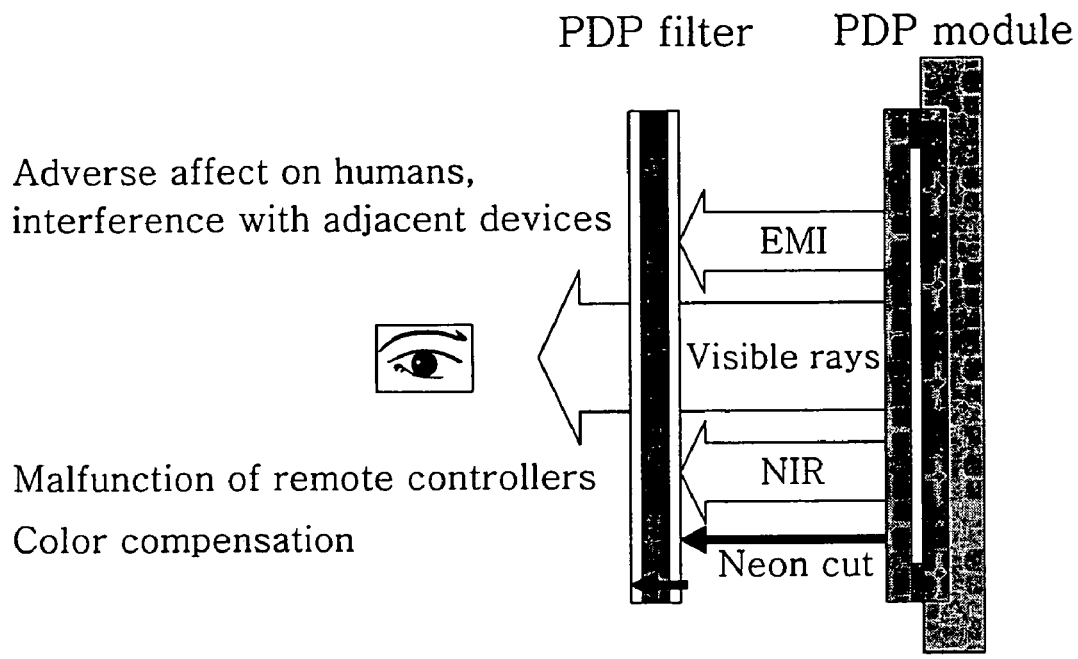
FIG. 1 is a view showing the overall structure of a general plasma display module and an optical filter thereof.
Figure 2:
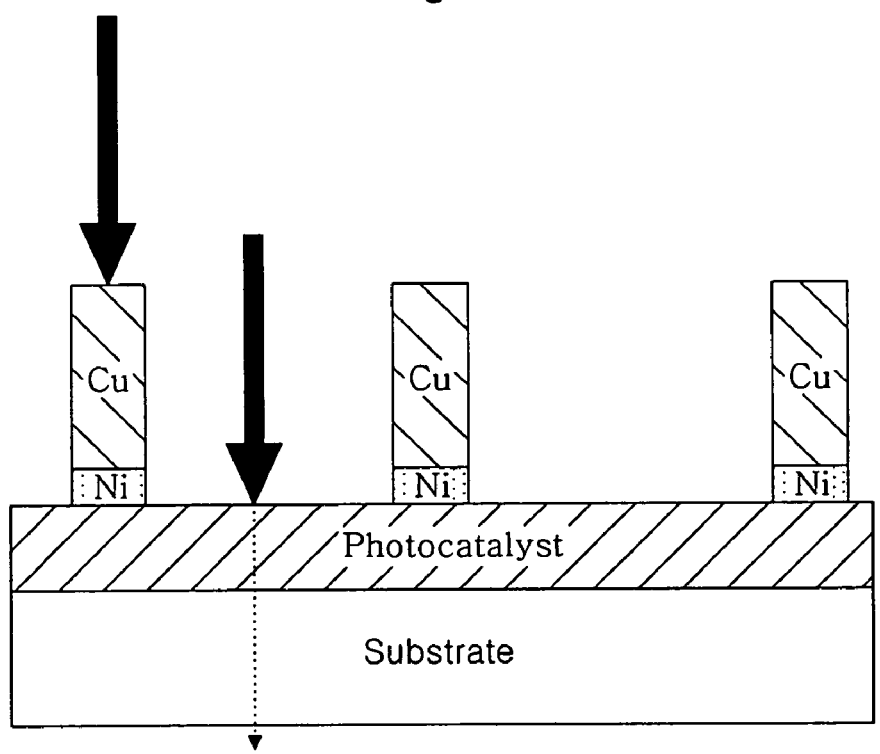
FIG. 2 is a cross-sectional view schematically showing the structure of an optical filter for image display devices in which a photocatalytic compound is not removed.
Figure 3:
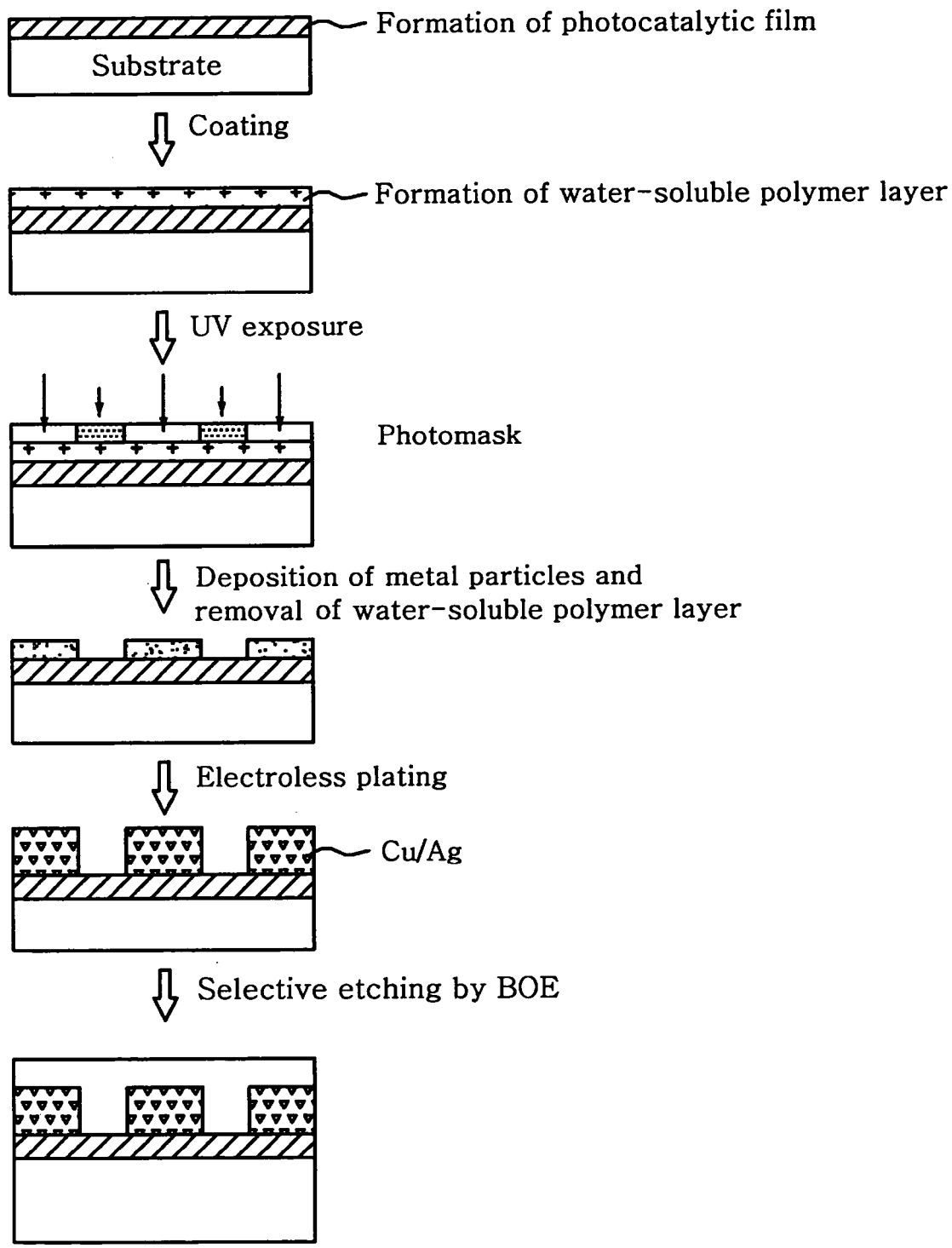
FIG. 3 shows a schematic view illustrating the procedure of a method for manufacturing an optical filter for image display devices according to one embodiment of the present invention.

FIG. 3 shows schematic views illustrating the procedure of a method for manufacturing an optical filter for image display devices according to one embodiment of the present invention. Referring to FIG. 3, a photocatalytic compound is coated on a substrate to form a photocatalytic film.

Examples of preferred transparent substrates that can be used in embodiments of the present invention include, but are not especially limited to, transparent plastic substrates and glass substrates. As materials for the transparent plastic substrates, there can be used acrylic resins, polyesters, polycarbonates, polyethylenes, polyethersulfones, olefin-maleimide copolymers, norbomene-based resins, and the like. In the case where excellent heat resistance is required, olefin-maleimide copolymers and norbomene-based resins are preferred. Otherwise, it is preferred to use polyester films, acrylic resins, and the like.

The term "photocatalytic compound" as used herein refers to a compound whose characteristics are changed by light. For example, the photocatalytic compound may be inactive when not exposed to light, but its reactivity is accelerated (i.e. activated) upon exposure to light, e.g., UV light. In addition, an inactive photocatalytic compound may be electron-excited by photoreaction upon light exposure, thus exhibiting a reducing ability. Preferred examples of the photocatalytic compound are Ti-containing organic compounds which can form $TiO_x$ (in which x is 0, 1 or 2) after coating and annealing. Specific examples of the Ti-containing organometallic compounds include, but are not particularly limited to, tetraisopropyl titanate, tetra-n-butyl titanate, tetrakis(2-ethyl-hexyl) titanate, and polybutyl titanate.

The coating thickness of a Ti-containing organic compound layer is preferably in the range of 30 nm to 1,000 nm. The photocatalytic compound may be dissolved in an appropriate solvent to prepare a coating solution, and then the coating solution may be coated on the substrate. After coating, the resulting structure may be heated on a hot plate or a microwave oven at a temperature preferably not higher than 200° C. for preferably not more than 20 minutes to form a transparent photocatalytic compound layer (e.g., a Ti-containing organic compound layer). Heating at a temperature exceeding 200° C. may lead to formation of a crystalline $TiO_2$ layer, unfavorably resulting in poor optical properties of the final optical filter.

A water-soluble polymeric compound may be coated on the photocatalytic compound layer to form a water-soluble polymer layer. The water-soluble polymer layer thus formed plays a roll in promoting photoreduction upon subsequent exposure to UV light, thus acting to improve the photocatalytic activity. Examples of water-soluble polymeric compounds that may be used in embodiments of the present invention include, but are not particularly limited to, homopolymers, such as polyvinylalcohols, polyvinylphenols, polyvinylpyrrolidones, polyacrylic acids, polyacrylamides, gelatins, etc., and copolymers thereof. For example, 30% or less of the water-soluble polymer is dissolved in water, and the resulting solution is coated on the Ti-containing organic compound layer, followed by heating, to form the final photocatalytic film.

A photosensitizer may be added to the aqueous water-soluble polymer solution to increase the photosensitivity of the water-soluble polymer layer. For example, the photosensitizer may include, but is not limited to, a water-soluble compound selected from colorants, organic acids, organic acid salts, and organic amines. Specific examples of the photosensitizer include tar colorants, potassium and sodium salts of chlorophylline, riboflavin and derivatives thereof, water-soluble annatto, $CuSO_4$, caramel, curcumine, cochinal, citric acid, ammonium citrate, sodium citrate, oxalic acid, potassium tartarate, sodium tartarate, ascorbic acid, formic acid, triethanolamine, monoethanolamine, and malic acid. The aqueous water-soluble polymer solution may be coated by the coating technique employed previously, and heated to a temperature preferably not higher than 80° C. for 5 minutes or less to evaporate water. The thickness of the water-soluble polymer layer is preferably controlled to 1 μm or less.

2. Formation of Latent Pattern Acting as Nucleus for Crystal Growth and Formation of Metal Pattern by Growth of Metal Crystal (i) Formation of Latent Pattern Acting as Nucleus for Crystal Growth The photocatalytic film formed in the first step is selectively exposed to UV light using a photomask to form a latent pattern acting as a nucleus for crystal growth consisting of active and inactive portions. In this step, exposure conditions such as exposure atmospheres and exposure doses are not especially limited, and may be properly selected according to the kind of photocatalytic compounds used.

In one embodiment, when the photocatalytic film is exposed to UV light, electron excitation occurs in the exposed portion, thus exhibiting activity, e.g., reducibility, and as a result, reduction of metal ions takes place in the exposed portion.

In this step, if necessary, the latent pattern acting as a nucleus for crystal growth may be dipped in an appropriate metal salt solution to form a metal particle-deposited pattern thereon and to remove the water-soluble polymer layer, if present, in order to effectively form a metal pattern. The deposited metal particles may play a role as catalysts accelerating growth of a metal crystal in the subsequent plating step. For example, when the pattern is plated with copper, nickel or gold, treatment with the metal salt solution is preferred. As the metal salt solution, an Ag salt solution, a Pd salt solution, or a mixed solution thereof is preferably used.

(ii) Formation of Metal Pattern

The latent pattern acting as a nucleus for crystal growth, or if desired, the metal particle-deposited pattern is subjected to plating to grow a metal crystal thereon to form a metal pattern. At this time, two or more metals may be grown by plating to form a multilayer metal pattern. The plating may be performed by electroless or electroplating.

In the case of the metal particle-deposited pattern formed by treating the latent pattern with a metal salt solution, since the pattern in which palladium or silver metal particles are deposited exhibits sufficient activity as a catalyst in an electroless plating solution, crystal growth is accelerated and thus a more densely packed metal pattern can be advantageously formed.

Plating metals, e.g., Ni, Cu, Ag, Au and alloys thereof, usable for the plating in embodiments of the present invention may be properly selected. To form a highly conductive metal pattern, a copper or silver compound solution is preferably used.

The electroless or electroplating may be achieved in accordance with well-known procedures. A more detailed explanation will be described below.

In the case where an electroless plating process is employed to grow a copper crystal, the substrate on which the latent pattern acting as a nucleus for crystal growth is plated may be dipped in a plating solution having a composition comprising 1) a copper salt, 2) a reducing agent, 3) a complexing agent, 4) a pH-adjusting agent, 5) a pH buffer, and 6) a modifying agent.

The copper salt may serve as a source providing copper ions to the substrate. Examples of the copper salt include chlorides, nitrates, sulfates, and cyanides of copper. Copper sulfates are preferred.

The reducing agent may act to reduce metal ions present on the substrate. Specific examples of the reducing agent include $NaBH_4$, $KBH_4$, $NaH_2PO_2$, hydrazine, formalin, and polysaccharides (e.g., glucose). Formalin and polysaccharides (e.g., glucose) are preferred.

The complexing agent may function to prevent precipitation of hydroxides in an alkaline solution and to control the concentration of free metal ions, thereby preventing the decomposition of metal salts and adjusting the plating speed. Specific examples of the complexing agent include ammonia solution, acetic acid, guanic acid, tartaric acid, chelating agents (e.g., EDTA), and organic amine compounds. Chelating agents (e.g., EDTA) are preferred.

The pH-adjusting agent may serve to adjust the pH of the plating solution, and may be an acidic or basic compound.

The pH buffer may inhibit sudden changes in the pH of the plating solution, and may be selected from organic acids and weakly acidic inorganic compounds.

The modifying agent may be a compound capable of improving coating and planarization characteristics. Specific examples of the modifying agent include common surfactants, and adsorptive substances capable of adsorbing components interfering with the crystal growth.

In the case where an electroplating process is employed to grow a copper crystal, the pattern may be dipped in a plating solution having a composition comprising 1) a copper salt, 2) a complexing agent, 3) a pH-adjusting agent, 4) a pH buffer and 5) a modifying agent. The functions and the specific examples of the components contained in the plating solution composition may be as defined in the electroless plating process for growth of a copper crystal.

In the case where an electroless plating process is employed to grow a silver crystal, the pattern may be dipped in a plating solution having a composition comprising 1) a silver salt, 2) a reducing agent, 3) a complexing agent, 4) a pH-adjusting agent, 5) a pH buffer, and 6) a modifying agent. Specific examples of the silver salt 1) include chlorides, nitrates and cyanides of silver. Silver nitrates are preferred. The functions and the specific examples of the other components contained in the plating solution composition may be as defined above.

In the case where an electroplating process is employed to grow a silver crystal, the pattern may be dipped in a plating solution having a composition comprising 1) a silver salt, 2) a complexing agent, 3) a pH-adjusting agent, 4) a pH buffer, and 5) a modifying agent. The functions and the specific examples of the components contained in the plating solution composition may be as defined above.

3. Selective Removal of Photocatalytic Film Using BOE

To increase the transmittance of the metal pattern thus formed, the photocatalytic layer formed on the transparent substrate is selectively etched and removed using a buffered oxide etchant (BOE) solution. As the metal patern functions as a protective layer for the underlying photocatalytic layer, portions of the photocatalytic film on which the metal pattern is not formed may be selectively etched by the BOE solution.

BOE is a chemical prepared by mixing ammonium fluoride ($NH_4F$) and hydrofluoric acid (HF). Preferably, the ammonium fluoride and hydrofluoric acid are mixed in a ratio of 7:1. HF directly participates in the etching of the photocatalytic compound, and $NH_4F$ serves as a buffer solution adjusting the etch rate to improve the uniformity.

When the BOE is used for etching, the concentration of the BOE, treatment temperature and time with the BOE, and stirring conditions may be appropriately selected. For example, the concentration of the BOE is preferably in the range of 0.015% to 5%, the treatment temperature is preferably in the range of 25° C. to 40° C., and the treatment time is preferably in the range of 5 seconds to 5 minutes.

Figure 4:
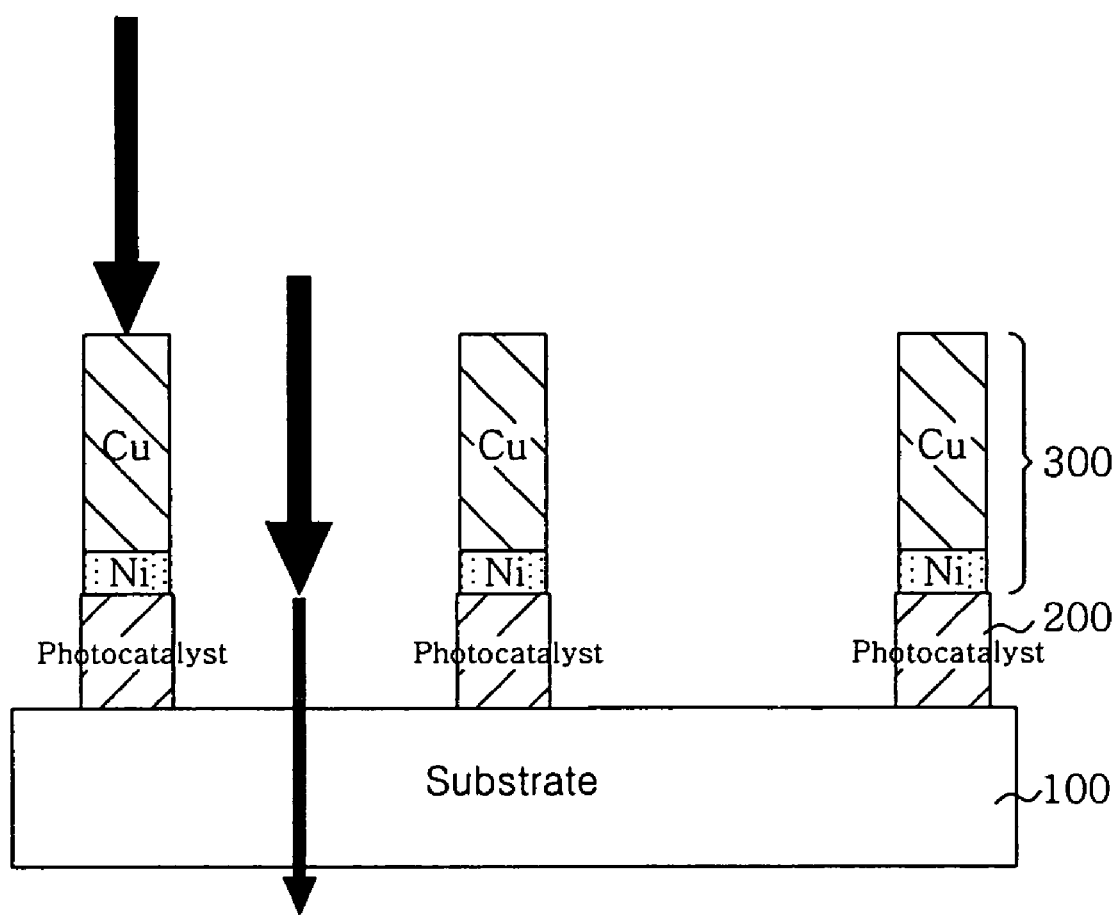
FIG. 4 is a cross-sectional view schematically showing the structure of an optical filter for image display devices in which a photocatalytic compound is selectively removed according to one embodiment of the present invention.

FIG. 4 is a cross-sectional view schematically showing the structure of an optical filter for image display devices manufactured by a method of embodiments of the present invention. According to the structure shown in FIG. 4, the optical filter of an embodiment of the present invention comprises a photocatalytic layer 200 and a metal pattern 300 formed on a transparent substrate 100. Since portions of the photocatalytic layer 200 on which the metal pattern 300 is not formed are completely removed, the optical filter of embodiments of the present invention exhibits improved transmittance. As shown in FIG. 4, embodiments of the present invention may have a metal pattern formed of two or more metals, of which Cu and Ni are illustratively shown. An antireflective film having reflection-preventing properties against visible rays may be formed in the optical filter of embodiments of the present invention.

The optical filter of embodiments of the present invention can be applied to a variety of image display devices, such as liquid crystal displays (LCDs), plasma display panels (PDPs), and electroluminescent displays (ELDs). When the optical filter of embodiments of the present invention is applied to plasma display panels (PDPs) and front plates thereof, particularly advantageous effects can be achieved.

EXAMPLES

Embodiments of the present invention will now be described in more detail with reference to the following examples. However, these examples are given for the illustration of the preferred embodiments of the present invention only, and are not to be construed as limiting the scope of the invention.

Examples 1 and 2

A solution of polybutyl titanate (2.5 wt %) in isopropanol was applied to a transparent glass substrate by spin coating, and was then dried at 150° C. for 5 minutes to form an amorphous $TiO_2$ film. At this time, the $TiO_2$ film was controlled to have a thickness of 30 mm to 100 nm. Thereafter, triethanol amine as a photosensitizer was added to an aqueous solution of 5 wt % of polyvinylalcohol (Mw: 25,000). At this time, the photosensitizer was used in an amount of 1% by weight, based on the weight of the polymer. The resulting mixture was stirred, coated on the $TiO_2$ film, and dried at 60° C. for 2 minutes. Next, UV light having a broad wavelength range was irradiated to the coated substrate through a photomask on which a fine mesh pattern was formed using a UV exposure system (Oriel, U.S.A). After the exposure, the substrate was dipped in a solution of $PdCl_2$ (0.6 g) and HCl (1 ml) in water (1 liter) to deposit Pd particles on the surface of the exposed portion. As a result, a negative pattern composed of Pd, acting as a nucleus for crystal growth, was formed.

The resulting substrate was dipped in an electroless copper plating solution to selectively grow a crystal of a metal pattern. The copper plating solution used herein was prepared so as to have a composition comprising 3.5 g of copper sulfate, 8.5 g of Rochelle salt, 22 ml of formalin (37%), 1 g of thiourea, 40 g of ammonia, and one liter of water. While maintaining the temperature of the copper plating solution at 35° C., the dipped substrate was subjected to electroless plating for 5 minutes to form a copper mesh pattern having a thickness of 2 μm and a line width of 10 μm. The copper mesh pattern was measured to have a sheet resistance of 0.01 Ω/sq. or lower. Subsequently, to increase the transmittance of the metal pattern formed on the glass substrate, the photocatalytic layer was selectively treated with a 1% buffered oxide etchant (BOE) solution at about 35° C. for the times indicated in Table 1 below.

The transmittance, resolution and resistivity of the optical filters manufactured in Examples 1 and 2 were measured. Further, an observation was made as to whether the photocatalytic layer remained or not. Further, electromagnetic wave shielding effects of the optical filters was evaluated. The results are shown in Table 1.

Comparative Example 1

An optical filter was manufactured in the same manner as in Example 1, except that the photocatalytic compound was not selectively removed using the BOE solution after formation of the metal pattern. The performance of the optical filter was evaluated according to the same procedure as in Example 1. The results are shown in Table 1.

Comparative Example 2

An optical filter was manufactured in the same manner as in Example 1, except that the treatment time with the BOE solution was changed to 3 seconds. The performance of the optical filter was evaluated according to the same procedure as in Example 1. The results are shown in Table 1.

TABLE 1

| Ex. No. | Etching time (BOE) | Transmittance (at 550 nm) | Surface resistance (Ω/sq.) | Resolution (μm) | Residual photocatalytic layer | Electromagnetic wave shielding effects |
|---|---|---|---|---|---|---|
| Comp. Ex. 1 | 0 sec. | 75.0% | 0.019 | 11 | Not removed | Average |
| Comp. Ex. 2 | 3 sec. | 79.5% | 0.02 | 11 | Partially removed | Average |
| Ex. 1 | 10 sec. | 85.1% | 0.02 | 10 | No residue | Excellent |
| Ex. 2 | 15 sec. | 85.5% | 0.02 | 10 | No residue | Excellent |

[Methods for Evaluation of Physical Properties]

Transmittance: Changes in transmittance before and after each of the optical filters manufactured in Examples 1 and 2 was mounted on a PDP were measured using a spectrometer.

The resistivity was measured using a 4-point probe.

The resolution was determined using an optical microscope.

The electromagnetic wave shielding effects were evaluated by measuring the transmittance of electromagnetic waves in the frequency range of 50 MHz to 1.5 GHz.

Examination of residual photocatalytic layer: An observation was made as to whether or not the photocatalytic layer was removed in portions other than where the metal pattern was formed using an optical microscope.

As can be seen from the data shown in Table 1, the optical filters manufactured in Examples 1 and 2 exhibit a 10% or more increase in transmittance and high resolution compared to the optical filters manufactured in Comparative Examples 1 and 2 in which the photocatalytic layer was not completely removed.

As apparent from the above description, according to a method of embodiments of the present invention, a metal pattern may be formed by forming a photocatalytic compound using a simple coating technique, followed by simple plating. Accordingly, an optical filter for image display devices can be manufactured within a short time in an efficient manner at low costs without the need for a sputtering process requiring high vacuum/high temperature conditions, a photopatterning process using a photosensitive resin or an etching process. In addition, according to a method of embodiments of the present invention, a photocatalytic layer remaining on a transparent substrate is selectively removed. Therefore, an optical filter manufactured by a method of embodiments of the present invention exhibits improved transmittance and resolution.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for manufacturing a high-transmittance optical filter for image display devices, comprising the steps of:
    coating a photocatalytic compound on a transparent substrate to form a photocatalytic film (a first step);
    selectively exposing the photocatalytic film to light to form a pattern and growing at least one metal crystal thereon by plating to form a metal pattern (a second step); and
    selectively etching and removing the photocatalytic compound remaining on the transparent substrate using a buffered oxide etchant (BOE) (a third step).

2. The method according to claim 1, wherein the transparent substrate is a glass substrate or a transparent plastic substrate selected from the group consisting of acrylic resins, polyesters, polycarbonates, polyethylenes, polyethersulfones, olefin-maleimide copolymers, and norbornene-based resins.

3. The method according to claim 1, wherein the photocatalytic compound used in the first step is a Ti-containing organic compound.

4. The method according to claim 3, further comprising the step of forming a photosensitizer-containing water-soluble polymer layer on the photocatalytic film.

5. The method according to claim 4, wherein the water-soluble polymer layer is formed of a material selected from the group consisting of polyvinylalcohols, polyvinylphenols, polyvinylpyrrolidones, polyacrylic acids, polyacrylamides, gelatins, and copolymers thereof.

6. The method according to claim 4, wherein the photosensitizer is at least one compound selected from the group consisting of tar colorants, potassium and sodium salts of chlorophylline, riboflavin and derivatives thereof, water-soluble annatto, $CuSO_4$, caramel, curcumine, cochinal, citric acid, ammonium citrate, sodium citrate, oxalic acid, potassium tartarate, sodium tartarate, ascorbic acid, formic acid, triethanolamine, monoethanolamine, and malic acid.

7. The method according to claim 4, further comprising the step of treating the selectively exposed photocatalytic film with a metal salt solution to deposit metal particles in the pattern and to remove the water-soluble polymer layer before growing a metal crystal in the second step.

8. The method according to claim 7, wherein the metal salt solution is an Ag salt solution, a Pd salt solution, or a mixed solution thereof.

9. The method according to claim 3, further comprising the step of treating the selectively exposed photocatalytic film with a metal salt solution to deposit metal particles in the pattern before growing a metal crystal in the second step.

10. The method according to claim 9, wherein the metal salt solution is an Ag salt solution, a Pd salt solution, or a mixed solution thereof.

11. The method according to claim 1, wherein the metal pattern is formed by growing two or more metal crystals by plating in the second step.

12. The method according to claim 1, wherein the plating is performed using a plating metal selected from the group consisting of Ni, Cu, Ag, Au and alloys thereof by electroless or electro-plating in the second step.

13. The method according to claim 1, wherein the concentration of the BOE is in the range of 0.015% to 5%.

14. The method according to claim 1, wherein the treatment temperature with BOE is in the range of 25° C. to 40° C.

15. The method according to claim 1, wherein the treatment time with BOE is in the range of 5 seconds to 5 minutes.

16. A high-transmittance optical filter for image display devices manufactured by the method according to claim 1.

17. An image display device comprising the optical filter according to claim 16.

* * * * *